(12) United States Patent
Tavkhelidze et al.

(10) Patent No.: US 8,575,597 B2
(45) Date of Patent: Nov. 5, 2013

(54) LIQUID METAL CONTACT AS POSSIBLE ELEMENT FOR THERMOTUNNELING

(75) Inventors: Avto Tavkhelidze, Tbilisi (GE); Leri Tsakadze, Tbilisi (GE); Zaza Taliashvili, Tbilisi (GE); Larissa Jangidze, Tbilisi (GE); Rodney Thomas Cox, North Plains, OR (US)

(73) Assignee: Borealis Technical Limited (GI)

( * ) Notice: Subject to any disclaimer, the term of this patent is extended or adjusted under 35 U.S.C. 154(b) by 52 days.

(21) Appl. No.: 11/982,286

(22) Filed: Oct. 31, 2007

(65) Prior Publication Data
US 2008/0061286 A1 Mar. 13, 2008

Related U.S. Application Data

(63) Continuation-in-part of application No. 11/974,313, filed on Oct. 12, 2007, now abandoned, which is a continuation-in-part of application No. 11/289,206, filed on Nov. 28, 2005, now Pat. No. 7,351,996, which is a continuation-in-part of application No. 10/534,633, filed as application No. PCT/IB03/06484 on Nov. 27, 2003, now Pat. No. 7,323,709.

(30) Foreign Application Priority Data

Nov. 27, 2002 (GB) .................................... 0227687.1
Oct. 13, 2006 (GB) .................................... 0620350.9

(51) Int. Cl.
*H01L 29/08* (2006.01)
*H01L 29/00* (2006.01)

(52) U.S. Cl.
USPC ...... 257/30; 257/324; 257/411; 257/E29.165; 257/E29.166

(58) Field of Classification Search
USPC ............. 257/30, 324, 411, E29.165, E29.166
See application file for complete search history.

(56) References Cited

U.S. PATENT DOCUMENTS 3,169,200 A    2/1965  Huffman
4,135,067 A *  1/1979  Bitko .......................... 200/61.52
(Continued)

FOREIGN PATENT DOCUMENTS

WO    WO-99/10688 A1    3/1999
WO    WO-99/13562 A1    3/1999

OTHER PUBLICATIONS

Tavkhelidze et al., "Electron tunneling through large area vacuum gap",Thermoelectrics, 2002. Proceedings ICT '02., Aug. 25, 2002, pp. 435-438, Piscataway, NJ, USA.
(Continued)

*Primary Examiner* — Cathy N Lam

(57) ABSTRACT

The use of liquid metal contacts for devices based on thermotunneling has been investigated. Electric and thermal characteristics of low wetting contact Hg/Si, and high wetting contacts Hg/Cu were determined and compared. Tunneling I-V characteristics for Hg/Si were obtained, while for Hg/Cu, I-V characteristics were ohmic. The tunneling I-V characteristic is explained by the presence of a nanogap between the contact materials. Heat conductance of high wetting and low wetting contacts were compared, using calorimeter measurements. Heat conductance of high wetting contact was 3-4 times more than of low wetting contact. Both electric and thermal characteristics of liquid metal contact indicated that it could be used for thermotunneling devices. To reduce the work function and make liquid metal more suitable for room temperature cooling, Cs was dissolved in liquid Hg. Work function as low as 2.6 eV was obtained.

19 Claims, 3 Drawing Sheets

(56) References Cited

U.S. PATENT DOCUMENTS

| | | |
|---|---|---|
| 4,747,698 A | 5/1988 | Wickramasinghe et al. |
| 6,064,137 A | 5/2000 | Cox |
| 6,365,912 B1 | 4/2002 | Booth et al. |
| 6,417,060 B2 | 7/2002 | Tavkhelidze et al. |
| 6,456,636 B1 * | 9/2002 | Koshihara et al. ............. 372/39 |
| 6,720,704 B1 | 4/2004 | Tavkhelidze et al. |
| 6,869,855 B1 * | 3/2005 | Tavkhelidze et al. ......... 438/380 |
| 2001/0046749 A1 | 11/2001 | Tavkhelidze et al. |
| 2002/0171078 A1 | 11/2002 | Eliasson et al. |
| 2003/0168957 A1 | 9/2003 | Sung |

OTHER PUBLICATIONS

Hishinuma et al., "Refrigeration by combined tunneling and thermionic emmission in vacuum: Use of nanometer scale design", Appl Phys Lett, Apr. 23, 2001, pp. 2572-2574, vol. 78, No. 1.

* cited by examiner

6a

6b

LIQUID METAL CONTACT AS POSSIBLE ELEMENT FOR THERMOTUNNELING

CROSS-REFERENCE TO RELATED APPLICATIONS

This application is a Continuation-in-Part of U.S. patent application Ser. No. 11/974,313, filed Oct. 12, 2007, which application claims the benefit of U.K. Patent Application No. GB0620350.9, filed Oct. 13, 2007. U.S. patent application Ser. No. 11/974,313 is also a Continuation-in-Part of U.S. patent application Ser. No. 11/289,206, filed Nov. 28, 2005, which is a Continuation-in-Part of U.S. patent application Ser. No. 10/534,633, filed May 11, 2005, which is the U.S. national stage application of International Application PCT/IB2003/006484, filed Nov. 27 2003, and which designates the United States, which international application was published on Jun. 10, 2004, as International Publication WO04049379 in the English language. International Application No. PCT/IB2003/006484 claims the benefit of GB Patent Application No. 0227687.1 filed on Nov. 27 2002.

The above documents are incorporated herein in their entirety by reference.

BACKGROUND OF THE INVENTION

This invention relates to tunnel junctions.

In recent years, much work has been done on using electron tunneling for cooling applications. The first theoretical investigation of cooling by means of electron tunneling was done to deal with overheating in single electron transistors [A. N. Korotkov, M. R. Samuelsen, S. A. Vasenko, "Effects of overheating in a single-electron transistor," J. Appl. Phys., 76 (6), p. 3623-3631, (1994)]. Inside the metal/insulator/metal (MIM) tunnel junction, electron tunneling takes place through an insulator layer, but because of the high thermal conductivity of ultra-thin insulator layer, the MIM junctions exhibited large heat backflow, which reduces cooling efficiency. Huffmann (U.S. Pat. No. 3,169,200) attempted a solution to the heat backflow problem, using multiple MIM tunnel junctions connected in series. However, a device of this type could not be fabricated because of its technological complexity. The present inventors have designed tunnel junctions of metal/vacuum/metal (MVM) type, having very low heat backflow [A. Tavkhelidze, G. Skhiladze, A. Bibilashvili, L. Tsakadze, L. Jangidze, Z. Taliashvili, I. Cox, and Z. Berishvili, Proc. XXI International Conf. on Thermoelectric, August 26-29 IEEE, New York, pp. 435-438 (2002); L. B. Jangidze, A. N. Tavkhelidze, M. O. Tetradze and T. N. Devidze, "Methods for improving surface flatness in thick Cu film electrodeposition", Russian Microelectronics, Vol. 36 (2), p. 116, (2007)]. Such tunnel junctions may be used for efficient cooling. A theoretical investigation of MVM tunnel junctions has shown that the cooling coefficient could be as high as 20-30% [Y. Hishinuma, T. H. Geballe, B. Y. Moyzhes, and T. W. Kenny, Appl. Phys. Lett. 78, 2572 (2001); T. Zeng, Appl. Phys. Lett. 88, 153104 (2006)]. An approach using emission from semiconductor resonant states across a vacuum gap has also been proposed [A. N. Korotkov and K. K. Likharev, Appl. Phys. Lett. 75, P. 2491-2493 (1999)].

Most cooling applications require tunnel junctions with a large area—of the order of square centimeter and more. The electrodes for tunnel junctions should be flat within few Angstroms to allow fabrication of uniform vacuum nano gap. Available polishing methods allow fabrication of surfaces with local roughness of 0.2 nm. However gradual deviation in the surface relief over large distances is as high as 500 nm per centimeter. The local roughness (0.2 nm) is low enough to obtain local vacuum tunneling, but because of a gradual deviation in the surface relief, it becomes impossible to bring large areas of two electrodes (polished independently) close enough to each other.

BRIEF SUMMARY OF THE INVENTION

The present invention solves this problem using liquid metal as one of the electrodes. Any liquid, including liquid metals, have surfaces that they wet, and surfaces that they do not wet. For example, liquid gallium will wet a silicon surface, but it will not wet a silica surface. Thus if a droplet of liquid gallium is placed on a silicon surface it will wet it and the droplet will assume a substantially flat shape. If the same droplet of liquid gallium is placed on the surface of silica, it will form almost spherical droplet. The physical mechanism of wettability is connected with interaction between surface and liquid atoms and could be ascribed to van der Waals forces between the atoms (molecules) of the two. In the case of the wettable pair (liquid metal and solid surface) the molecules of surface attract the molecules of liquid metal. In the case of non-wettable pair molecules of surface repel molecules of liquid metal. In the case of non-wettable pair there is no direct contact between the droplet and surface molecules. The absence of direct contact leads to such effects as very low friction and very low diffusion of liquid metal molecules into the surface. Furthermore, in some cases, there is no direct thermal and electric contact between the liquid metal and the solid surface, and electrons tunnel between the electrodes.

In broad terms, the present invention is concerned with the use of a non-wettable liquid/solid pair in thermotunnel devices. It is particularly concerned with the situation in which both the solid surface and the liquid metal are electrically conductive, and the pair could be used as electrodes of thermotunnel devices. Because of the weak interaction between the molecules of the non-wettable pair, heat conductivity of the junction is very low. In addition, because of the very short distance between the molecules of the liquid metal and the solid surface, the probability of electron tunnelling between them is high. Thus, in one aspect, the present invention is a tunnel junction having high electron tunnelling probability and low thermal conductivity. This is ideal for thermotunnel devices. In a further aspect the present invention the liquid metal of the non-wettable pair junction repeats the shape of the solid surface and provides conformal electrodes.

Thus the present invention is a diode device comprising: a first electrode, a second electrode and a liquid metal disposed between the electrodes, in which the liquid metal is in contact with the first and second electrodes, and the liquid metal does not wet said first electrode. The diode device may additionally comprise a non-wettable housing, preferably cylindrical. The diode device may additionally comprise a piston means able to change a volume of the liquid metal.

In a preferred embodiment, the liquid metal has a low work function. The low function metal may be, for example, caesium.

In a preferred embodiment, the liquid metal comprises gallium or mercury.

In a further preferred embodiment the diode device additionally comprising an insulator layer in contact with the second electrode. Preferably the insulator layer has a thickness of between 5 and 200 Å, most preferably in the range of 120 Å. Preferably the insulator comprises a metal oxide, most preferably silicon nitride or aluminum nitride.

Given design has following technical advantages. Liquid metal automatically repeated the shape of the base electrode. Base electrode geometry change due to mechanical stress and thermal extraction, is automatically adopted by liquid metal electrode. There is no need in precise regulation of inter-electrode distance. Thus there is not a need to provide additional inter-electrode distance regulation. Distance between the non-wettable solid electrode and the liquid metal will remain constant, despite thermal expansions and vibrations. Thermal expansion of the parts will change the curvature of liquid metal on the perimeter a little bit. Thus piezoelectric regulators and associated electronics may be dispensed with. Liquid metal automatically repeated the shape of the base electrode. Base electrode geometry change due to mechanical stress and thermal extraction, is automatically adopted by liquid metal electrode. There is no need in precise regulation of interelectrode distance.

According to this design, gravitational force acts to increase the non-wettable junction gap.

BRIEF DESCRIPTION OF THE SEVERAL VIEWS OF THE DRAWING

For a more complete explanation of the present invention and the technical advantages thereof, reference is now made to the following description and the accompanying drawing in which.

DETAILED DESCRIPTION OF THE INVENTION

Figure 1:
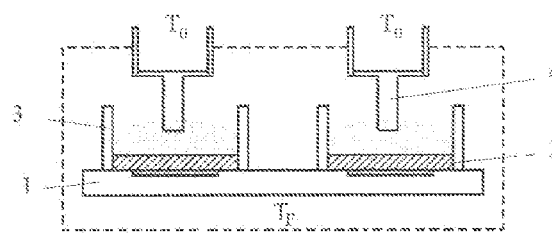
FIG. 1 shows the experimental setup for measuring electric and thermal characteristics of wetting contacts.

Electric and thermal characteristics of low wetting contact Hg/Si (100) and high wetting contact Hg/Cu under identical conditions have been experimentally investigated. To reduce the work function of the liquid metal, Cs was dissolved in it and low work function Hg+Cs contact was investigated in comparison with low wetting Hg contact. Round Si (100) substrates with a resistance <0.002 Ohm cm, having diameter of 20 mm and thickness of 2 mm were used as solid base for contacts. Si substrate was chosen as base electrode because it has a very flat and uniform surface. Heavily doped n-type Si was used to get contact close to MVM type. To achieve good thermal and electric contact with Si substrate (for high wetting contact Hg/Cu), Ti/Ag thin films were deposited on Si in vacuum ($10^{-6}$ Torr.). To remove contamination from Hg, it was first boiled in dimethilformamide for 3 minutes and was washed in deionized water for 5 minutes. Next Hg was purified by dissolving in $HNO_3$ (30% solution) and was mixed for 1 hour. $HNO_3$ solution was renewed 2-3 times during mixing. Next Hg was washed in deionized water for 30 minutes and was stored under water. Conventional cleaning procedure was used for Si substrate. Additionally, thick Cu disc (0.5 mm) was grown electrochemically on Si/Ti/Ag substrate to obtain high wetting contact between Cu and Hg. To exclude contamination of Hg from atmosphere, measurements were made in vacuum environment $10^{-3}$ Tor. Contacts with similar geometry were placed in vacuum chamber (see FIG. 1). Si substrates (2) were placed on the Cu flange (1) and were thermally anchored to it using liquid metal (In+Ga). Thin wall Teflon delimiters (3) were placed on Si wafers to contact edges. Pots obtained in this way were filled with liquid metal of equal weights. Cu rods (4), thermally anchored to small external baths were placed inside the liquid metal. External baths were used as heat reservoirs. Volume depicted by dashed line in FIG. 1 was evacuated. Cr/Al differential thermocouples were installed on the Cu flange and placed inside the liquid metal pots. Two Tungsten probes (not shown in FIG. 1) were placed in each liquid metal pot to do four probe electric measurements. Another two contact probes were attached to the Cu flange. Electric heater was attached to the Cu flange. During recording of the thermal end electric characteristics, both contacts were in the same vacuum and thermal conditions. Temperatures were monitored using differential and single thermocouples. Temperatures were stabilized to within 1.5-2 C during measurements.

To reduce the work function of Hg (4.5 eV) Cs was dissolved in it. Cesiation of Hg was done by mixing CsCl crystals with liquid Hg followed by heating to T=580 K for 10 hours. Work function of the mixture was measured using a Kelvin probe. Minimum value obtained for the work function was 2.6 eV, which is in agreement with V. S. Fomenko, "Handbook of Thermionic Properties" (Plenum, New York, 1966). Work function value was stable for the period of time in which the measurement were made (several days). All alkali materials dissolve in Hg, and their solubility increases with temperature. Solubility of Cs was 6.5% at room temperature and 31% at 480 K [Gavze M. N. "Corrosion and wetting of metals by Hg", p. 199, Moscow ("Nauka", Moscow 1969)]. To validate the composition of the solution obtained, X-ray analysis was used. Samples were cooled down in liquid nitrogen to T=77 K prior to analysis, to transform sample to crystal form. Peaks of Cs, Hg, CsCl and $Cs_2O$ were recorded.

Figure 2:
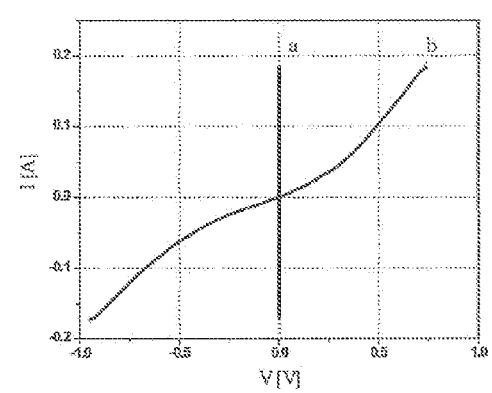
FIG. 2 shows the I-V characteristics of: (a) high wetting Hg/Cu contact and (b) low wetting Hg/Si contact.

I-V characteristics of contacts were recorded using a four point probe. In the case of low wetting, I-V characteristics indicated tunneling and were almost symmetric FIG. 2, line a. Zero bias resistance varied between 3 and 9 ohms in separate experiments. In the case of high wetting, I-V characteristics were almost ohmic (FIG. 2, line b), with zero voltage resistance of the order of 15-18 m Ohm. Thus zero bias resistance ratio of high and low wetting contacts ($R_{Si}/R_{Cu}$) was in the range of $10^2$-$10^3$. In the case of (Hg+Cs)/Si contacts I-V characteristics were tunneling and differed from I-V characteristics of Hg/Si contacts only quantitatively. Predominantly they had shown approximately 10 times more currents for the same voltages. However, tunneling current changed with time in irregular manner. Tunneling current differed dramatically from sample to sample. Instability could be explained by presence of CsCl grains in Hg+Cs mixture.

To compare thermal conductance of low and high wetting contacts a temperature gradient was applied between common Cu flange and thermal reservoirs, and the temperature gradients measured on contacts. Common Cu flange was heated using electric heater and thermal reservoirs were filled with water ice solution or liquid nitrogen. In the measurement setup, the ratio of thermal conductivities could be found using formula:

$$\lambda_2/\lambda_1 = (T_{LM1} - T_0)(T_F - T_{LM2})/(T_{LM2} - T_0)(T_F - T_{LM1}) \quad (1)$$

Here $\lambda_2$ and $\lambda_1$ are thermal conductivities of two contacts, $T_0$ is temperature of the external baths (FIG. 1), $T_F$ is temperature of the common Cu flange, $T_{LM1}$ and $T_{LM2}$ are temperatures of the liquid metals in baths #1 and #2. Measurements were made for set of fixed temperatures and results were compared. For example, the following set of temperatures $T_0 = 273$ K; $T_F = 316.7$ K, $T_{LM1} = 290.4$ K and $T_{LM2} = 303.6$ K gave a value for $\lambda_2/\lambda_1 = 0.28$. Roughly same values were obtained for other sets of temperatures. Consequently thermal conductivity was 3-4 times higher for contact with high wetting Hg/Cu compared to contact with low wetting Hg/Si. Thermal radiation was not included in Equation (1). Radiation loses in the setup were negligible for the temperatures used.

The assumption that in the case of low wetting there was nano gap between the liquid metal and solid electrode was based on following experimental results. First, I-V characteristics of low wetting contacts were tunneling, unlike I-V characteristics of high wetting contacts which were ohmic. Secondly, zero point resistance of low wetting contact was much higher than of high wetting contact. Thirdly, heat conductance of low wetting contact was considerably less than of high wetting contact. Modeling of liquid metals near low wetting surfaces suggests that the liquid creates intermediate layer of its vapor [S. M. Dammer and D. Lohse, Phys. Rev. Lett., v. 96, 206101, (2006)]. In order to verify this in the present experiment, Ar gas was allowed in the vacuum chamber under pressure of 0.8 Bar. There was no change in I-V characteristics of low wetting contact introduced by Ar gas.

It should be noted that all types of contacts investigated exhibited instability of electric characteristics in atmosphere. Even high wetting contact Hg/Cu eventually had shown tunneling I-V characteristic. This may be explained by absorption of air and water vapor on the surface, which leads to the creation of gas filled nanogap between the electrodes.

Figure 3:
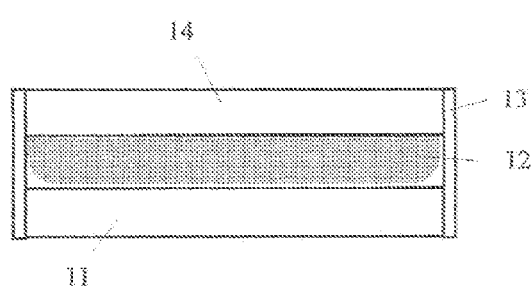
FIG. 3 shows a possible design of non-wettable thermo-tunnel device of the present invention.

Embodiments of the present invention and their technical advantages may be best understood by referring to FIG. 3, which shows one embodiment of a thermotunnel device of the present invention. According to this embodiment, liquid metal 12 is disposed between first electrode 11 and second electrode 14. The properties of the liquid metal are such that it wets only electrode 14, which means that there is little or no direct thermal and electric contact between the liquid metal and the surface of electrode 11, allowing electrons to tunnel from electrode 11.

In one preferred embodiment, the electrode 11 is Si, and the liquid metal is one that does not wet Si. Preferably, Si is heavily doped n-type Si to provide good electrical properties. In a further preferred embodiment, second electrode 14 is Cu, and the liquid metal is one that wets Cu. Preferably the Cu is formed on Si as a Si/Ag/Ti/Cu composite. Preferably, Si is heavily doped n-type Si to provide good electrical properties.

In a preferred embodiment, the electrodes and the liquid metal are retained within a non-wettable housing 13. In a further preferred embodiment, the housing is cylindrical.

Figure 4:
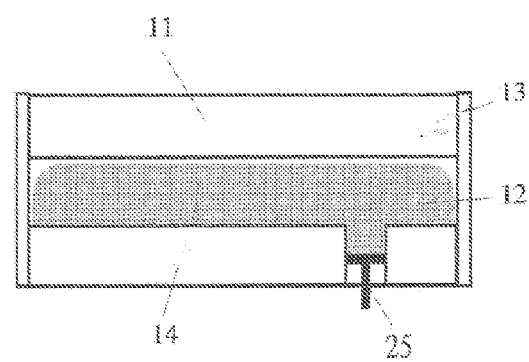
FIG. 4 shows a further embodiment of the present invention having a piston to change the volume of liquid metal and to regulate inter-electrode distance.

Referring now to FIG. 4, which shows a further embodiment of the present invention having a means to regulate inter-electrode distance, a piston 25 is able to change the volume of liquid metal and to regulate thereby the inter-electrode distance.

Clearly, for the embodiments shown in FIGS. 3 and 4, electrodes will be conformal.

The liquid metal utilized in the present invention may be any liquid metal that wets one electrode but not the other, such as liquid gallium or Hg. Preferably, the liquid metal should have a low work function, and is most preferably Cs dissolved in Hg. Alternatively, the liquid metal is caesium, which has a melting temperature of 29° C. It could be mixed with some other liquid metal, such as gallium, to form a suitable mixture having a low work function. In a further alternative embodiment, the liquid metal may be one comprising absorbed water or, which leads to the formation of a gas-filled nanogap that prevents wetting.

It should be noted that the width of tunnelling barrier will be of the order of 50-100 nm in the case of liquid metal-surface junction, and therefore the extremely low width of tunnel barrier will allow use of higher work function electrodes.

Figure 5:
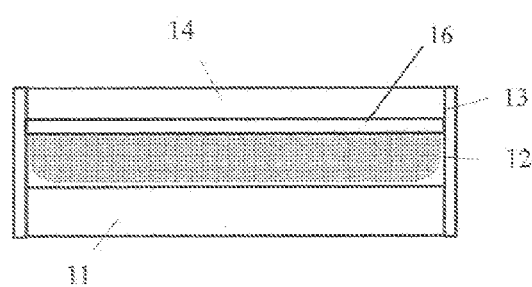
FIG. 5 shows a further embodiment of the present invention including an insulator layer.

Efficiency could be further increased by introduction of insulator coating of the collector electrode (MVIM tunnel junction), as disclosed in U.S. Patent Appl. Pub. Nos. 2006/0060835 and 2006/0192196, in which the potential profile inside the MVIM junction is altered so that the tunneling probability of high-energy electrons is increased and tunneling probability of low-energy electrons is reduced. This is illustrated diagrammatically in FIG. 5, which shows an insulator layer 16 disposed on electrode 14.

It is well known that when an electric field E is applied to an insulator it causes polarization of the insulator atoms and the resulting field is decreased inside the insulator. Thus the field inside the insulator, $E_1$ is equal to $E/\in$, where $\in$ is the dielectric constant of the insulator.

Figure 6:
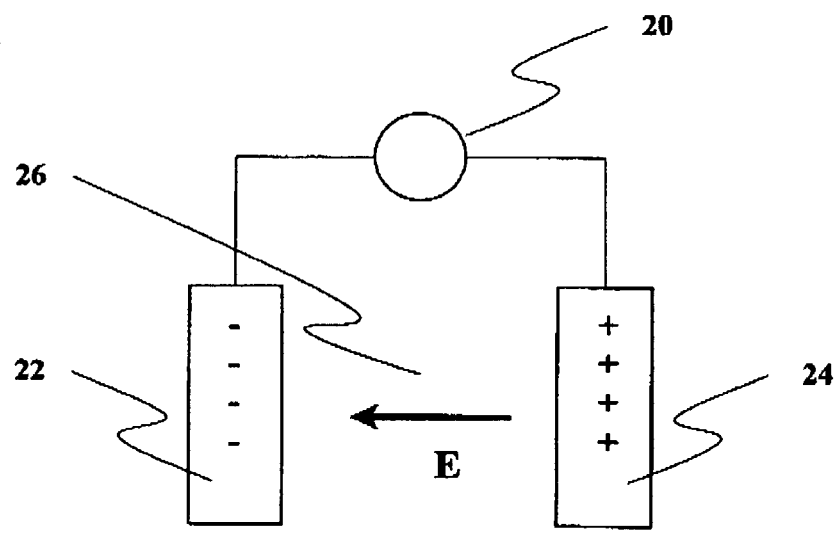
FIG. 6 is a diagrammatic representation of prior art tunneling devices (FIG. 6*a*) and a tunneling device of the present invention (FIG. 6*b*)
Figure 6:
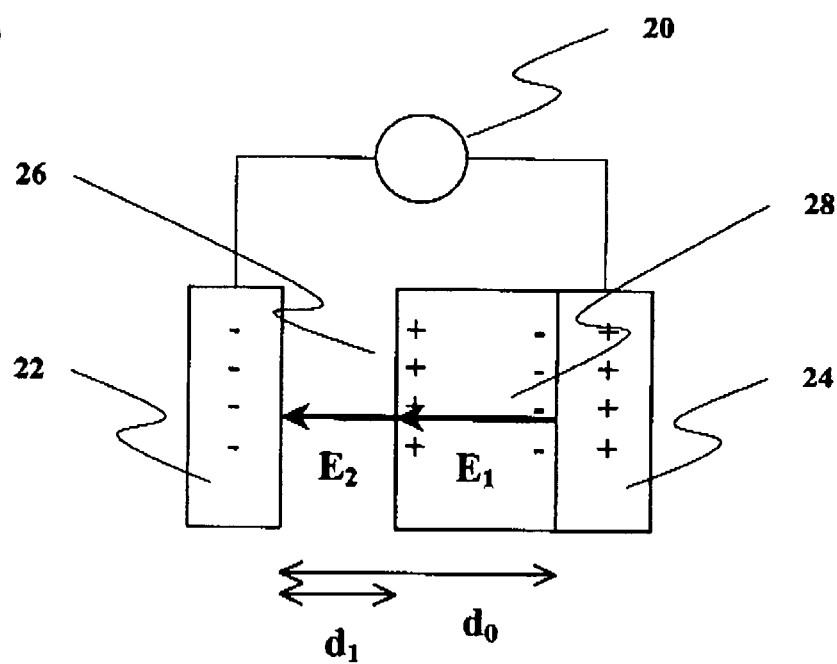

Referring now to FIG. 6a, which shows a prior art tunneling device, an emitter electrode 22 and a collector electrode 24 are separated by a vacuum gap. Upon application of an external voltage 20, $V_{bias}$, the field in the vacuum area between the electrodes is E.

Figure 7:
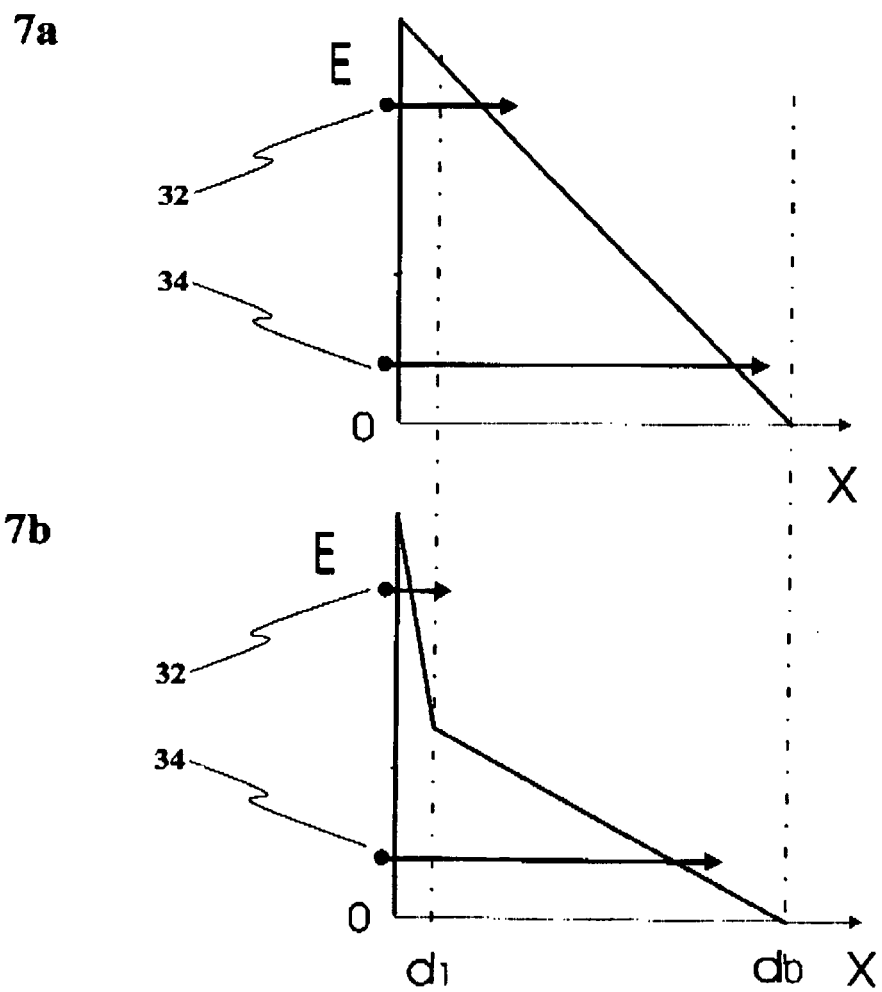
FIG. 7 is a diagrammatic representation of potential energy-distance profiles for prior art tunneling devices (FIG. 7*a*) and a tunneling device of the present invention (FIG. 7*b*).

Referring now to FIG. 7a, which shows the relationship between potential energy E and electrode separation X for the two electrodes of FIG. 6a, high energy electrons 32 and low energy electrons 34 are able to tunnel across the energy barrier. The high energy electrons have to overcome a thinner barrier than the low energy electrons, but the lower energy levels around the Fermi level are much more highly populated than the higher energy levels, and thus the efficiency of heat pumping is low, as discussed above.

Referring now to FIG. 6b, which shows a tunneling device of the present invention, in addition to electrodes 22 and 24, and liquid metal 26, an insulator 28 is placed between the electrodes and attached to the collector electrode. This creates a field $E_1$ inside the insulator layer and field $E_2$ in the vacuum between the insulator and metallic electrode. The field inside the insulator will therefore decrease and the field in vacuum gap between the insulator and metallic electrode will increase, and thus $E_2 > E > E_1$.

Referring now to FIG. 7b, which shows the relationship between potential energy E and electrode separation X for the two electrodes of FIG. 6b, high energy electrons 32 and low energy electrons 34 are able to tunnel across the energy barrier as in FIG. 7a. Now, however, when the same $V_{bias}$ is applied, the relationship between energy and distance has two slopes: in the range $0-d_1$, the slope corresponds to field $E_2$ in the liquid metal between the insulator and emitter electrode, and in the range $d_1-d_0$ the slope corresponds to the field $E_1$ inside the insulator. It is obvious that now the high energy electrons of FIG. 7b have to overcome a thinner barrier than electrons with the same energy in FIG. 7a, while at the same time tunneling conditions for low energy electrons remain approximately the same (compare FIGS. 7a and 7b). In this way, for the electrode arrangement of FIG. 6b, the energy spectrum of the tunneling electrons will shift in the direction of higher energies, which will in turn dramatically increase COP (Coefficient of Performance or useful cooling power).

In a preferred embodiment, the insulator layer is a metal oxide. In a particularly preferred embodiment the insulator layer is silicon nitride or aluminum nitride. Typically the insulator layer has a thickness of between 5 and 200 Å, preferable in the range of 120 Å.

The invention claimed is:

1. A diode device comprising:
   (a) a first electrode made of a first solid material having a first electrode surface;
   (b) a second electrode made of a second solid material having a second electrode surface spaced apart from said first electrode surface; and
   (c) a low work function liquid metal disposed in the space between said first electrode surface and said second electrode surface to conform said first and second electrode surfaces;
   wherein said liquid metal is selected to form a non-wettable electrode pair with said first electrode surface, wherein said liquid metal does not wet and is not in direct thermal and electric contact with said first electrode surface, forming a gap between said first electrode surface and said liquid metal, and said liquid metal is selected to form a wettable electrode pair with said second electrode surface, wherein said liquid metal wets and directly contacts said second electrode surface.

2. The diode device of claim 1 additionally comprising a housing, wherein said liquid metal does not wet said housing.

3. The diode device of claim 2 wherein said housing is cylindrical.

4. The diode device of claim 1 wherein said liquid metal comprises mercury or gallium.

5. The diode device of claim 1 wherein said liquid metal additionally comprises absorbed water or gas.

6. The diode device of claim 1 wherein said liquid metal comprises caesium.

7. The diode device of claim 1 additionally comprising a piston means able to change a volume of the liquid metal.

8. The diode device of claim 1 wherein said first electrode first solid material comprises silicon and said liquid metal does not wet silicon.

9. The diode device of claim 1 wherein said second electrode second solid material comprises silica and said liquid metal wets silica.

10. The diode device of claim 1 wherein said second electrode second solid material comprises copper and said liquid metal wets copper.

11. The diode device of claim 1 additionally comprising an insulator layer in contact with said second electrode.

12. The thermotunneling device of claim 11 wherein said insulator layer has a thickness of between 5 and 200 Å.

13. The thermotunneling device of claim 11 wherein said insulator layer has a thickness in the range of 120 Å.

14. The thermotunneling device of claim 11 wherein said insulator comprises a metal oxide.

15. The thermotunneling device of claim 11 wherein said insulator comprises silicon nitride or aluminum nitride.

16. The diode device of claim 1, wherein said liquid metal comprises caesium dissolved in mercury.

17. A thermotunnel device including a tunnel junction with high electron tunneling probability and low thermal conductivity comprising a low work function liquid metal interposed between a first electrically conductive electrode surface non-wettable by said liquid metal and a second electrically conductive electrode surface wettable by said liquid metal, wherein said liquid metal conforms to a shape of said first non-wettable electrode surface without directly thermally and electrically contacting said first non-wettable electrode surface, thereby forming a gap, and said liquid metal conforms to a shape of said second wettable electrode surface while directly thermally and electrically contacting said second wettable electrode surface.

18. The thermotunnel device of claim 17, wherein said liquid metal comprises caesium dissolved in mercury, said first non-wettable electrode surface is formed of heavily-doped n-type silicon, and said second wettable electrode surface is formed of copper.

19. The thermotunnel device of claim 17, wherein said gap maintains a constant distance between said liquid metal and said first non-wettable electrode surface.

* * * * *